(12) United States Patent
Shin et al.

(10) Patent No.: US 11,501,832 B2
(45) Date of Patent: Nov. 15, 2022

(54) MEMORY CONTROLLER FOR CONTROLLING RESISTIVE MEMORY DEVICE AND MEMORY SYSTEM INCLUDING THE SAME

(71) Applicant: SK hynix Inc., Gyeonggi-do (KR)

(72) Inventors: Won Gyu Shin, Gyeonggi-do (KR); Jung Hyun Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/205,647

(22) Filed: Mar. 18, 2021

(65) Prior Publication Data

US 2022/0108747 A1  Apr. 7, 2022

(30) Foreign Application Priority Data

Oct. 7, 2020 (KR) .................. 10-2020-0129363

(51) Int. Cl.
*G11C 7/10* (2006.01)
*G11C 13/00* (2006.01)

(52) U.S. Cl.
CPC ........ *G11C 13/0069* (2013.01); *G11C 7/1012* (2013.01); *G11C 7/1063* (2013.01); *G11C 13/004* (2013.01); *G11C 13/0023* (2013.01); *G11C 13/0061* (2013.01)

(58) Field of Classification Search
CPC .................................................. G11C 13/0069
USPC ........................................................ 365/148
See application file for complete search history.

(56) References Cited

U.S. PATENT DOCUMENTS

| 7,225,311 B2* | 5/2007 | Ware ................ G11C 29/50012 710/110 |
| 9,978,430 B2* | 5/2018 | Seo .................... G11C 11/40611 |
| 10,572,168 B2* | 2/2020 | Parikh ................... G06F 3/0683 |
| 2009/0237978 A1* | 9/2009 | Lee .................... G11C 13/0061 365/189.15 |

FOREIGN PATENT DOCUMENTS

KR 10-2017-0026116 3/2017

* cited by examiner

*Primary Examiner* — Muna A Techane
(74) *Attorney, Agent, or Firm* — IP & T Group LLP

(57) ABSTRACT

According to an embodiment, a memory system comprises a resistive memory device configured to perform a read operation and a write operation based on a command and an address, wherein the resistive memory device includes a plurality of banks each including a plurality of memory cells; and a memory controller configured to schedule a request from a host to generate the command and the address, wherein, when a time interval is less than a first time, the memory controller is configured to stop generation of the command and re-schedule the command corresponding to the request, the time interval spanning from a time of generation of a prior write command for a same memory cell to a time of generation of the command generated according to the request.

25 Claims, 14 Drawing Sheets

MEMORY CONTROLLER FOR CONTROLLING RESISTIVE MEMORY DEVICE AND MEMORY SYSTEM INCLUDING THE SAME

CROSS-REFERENCE TO RELATED APPLICATIONS

The present application claims priority of Korean Patent Application No. 10-2020-0129363, filed on Oct. 7, 2020, which is herein incorporated by reference in its entirety.

BACKGROUND

1. Field

One or more embodiments described herein relate to a memory system that includes a memory controller for controlling a memory device.

2. Description of the Related Art

Demand for higher-capacity and lower-power semiconductor memory devices leads to research for next-generation non-volatile memory devices that do not need be refreshed. Examples of such next-generation memory devices include PCRAM (Phase Change Random Access Memory) using a phase change material, ReRAM (Resistive Random Access Memory) using a material having variable resistance characteristics such as transition metal oxide, and MRAM (Magnetic Random Access Memory) using a ferromagnetic material. The materials constituting these next-generation semiconductor memory devices have a resistance value that varies according to current or voltage, and may maintain the resistance value even when the supply of current is cut off. These devices may also exhibit high operational speeds.

Notable among these is the PCRAM. Although it is a non-volatile memory device, the PCRAM allows for random data access and therefore may be adopted in many types of memory systems.

SUMMARY

According to the disclosure, there is provided a semiconductor memory system including a memory controller capable of re-inserting a request that does not meet a lock-out time of a resistive memory device, to a scheduler when generating a command according to a request from a host.

According to an embodiment, a memory system comprises a resistive memory device configured to perform a read operation and a write operation based on a command and an address, wherein the resistive memory device includes a plurality of banks each including a plurality of memory cells; and a memory controller configured to schedule a request from a host to generate the command and the address, wherein, when a time interval is less than a first time, the memory controller is configured to stop generation of the command and re-schedule the command corresponding to the request, the time interval spanning from a time of generation of a prior write command for a same memory cell to a time of generation of the command generated according to the request.

According to an embodiment, a memory controller comprises a first queue configured to store a request from a host; a scheduler configured to select and schedule either the request or a re-request; a plurality of bank machines configured to generate command generation information by managing timing parameters for respective banks included in a memory device according to a request allocated by the scheduler; a lock-out manager configured to determine whether to issue the command generation information or the re-request based on a first time that corresponds to a minimum time interval set to generate a command to, after generating a command for performing a write operation on a memory cell included in a bank, perform a subsequent write operation or read operation on the same memory cell; a second queue configured to store the command generation information; and a command/address generator configured to generate a command and an address according to information stored in the first queue and the second queue.

According to an embodiment, a method for operating a memory controller comprises storing a request from a host in a first queue; selecting and scheduling either the request or a re-request; generating command generation information by managing timing parameters for respective banks included in a memory device according to a request allocated by a scheduler; determining whether to issue the command generation information or the re-request based on a first time that corresponds to a minimum time interval set to generate a command to, after generating a command for performing a write operation on a memory cell included in a bank, perform a subsequent write operation or read operation on the same memory cell; storing the command generation information in a second queue; and generating a command and an address according to information stored in the first queue and the second queue.

According to embodiments of the disclosure, after generating a command for performing a write operation on a memory cell of a resistive memory device, the memory system generates a command considering the lock-out time, which is the minimum time interval set to generate a command for performing a subsequent write operation or read operation on the same memory cell, thereby securing the reliability of the resistive memory device.

DETAILED DESCRIPTION

Hereinafter, embodiments of the disclosure are described below in detail with reference to the accompanying drawings to allow one of ordinary skill in the art to readily practice the technical spirit of the disclosure. Well known components or elements irrelevant to the subject matter of the disclosure may be omitted from the description. The same or substantially the same reference denotations are used to refer to the same or substantially the same elements throughout the specification and the drawings.

Figure 1:
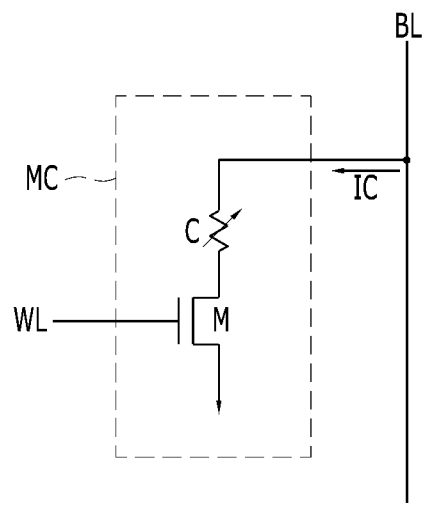
FIG. 1 illustrates an embodiment of a memory cell of a resistive memory device.

FIG. 1 is a view illustrating an embodiment of a memory cell MC, which, for example, may be included in a resistive memory device.

Referring to FIG. 1, memory cell MC includes a variable resistor C and an access transistor M. The variable resistor C is (directly or indirectly) connected to a bit line BL. The access transistor M is connected (directly or indirectly) between the variable resistor C and a reference potential, e.g., ground. A word line WL is connected (directly or indirectly) to the gate of the access transistor M. When a predetermined voltage is applied to the word line WL, the access transistor M is turned on. When the access transistor M is turned on, the variable resistor C receives a current Ic through the bit line BL.

When the variable resistor C includes a phase change material, the resistive memory device may be configured as a phase change memory device. The phase change material may include chalcogenide alloy having a crystal state or an amorphous state dependent on temperature. A different phase change material may be used in another embodiment.

The phase change material may be heated in various ways. One method may involve using a laser beam, and another method may involve using electric current. In some cases, using electric current to heat the phase change material may be more suitable in terms of ease of implementation of a memory chip. Accordingly, the phase change memory device may write data using the characteristics of the phase change material that changes to the crystal state or the amorphous state according to the current Ic supplied through the bit line BL.

Figure 2:
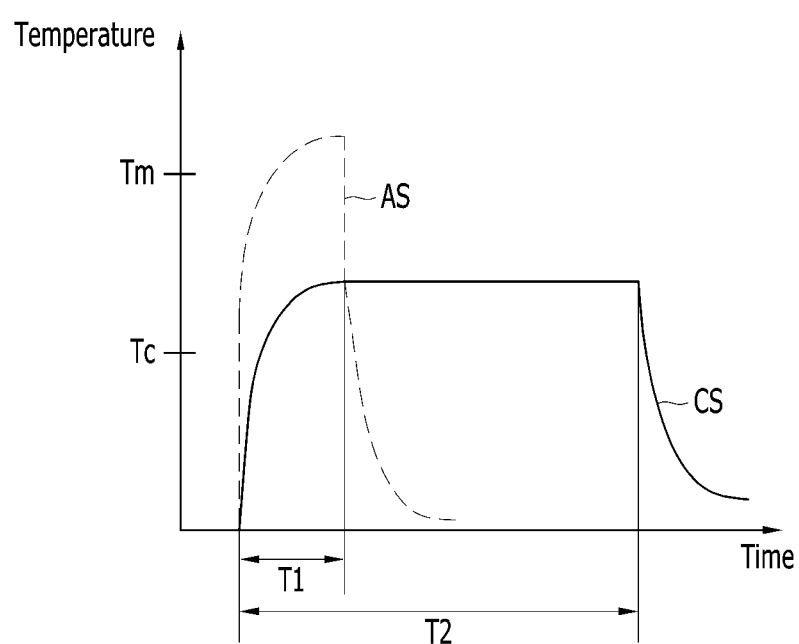
FIG. 2 illustrates example characteristics of phase change material of a memory cell.

FIG. 2 is a graph illustrating an example characteristics of a phase change material of a memory cell MC of a resistive memory device. In FIG. 2, reference denotation "AS" refers to a condition for the phase change material to enter the amorphous state (hereinafter, referred to as a reset pulse AS), and reference denotation "CS" refers to a condition to enter the crystal state (hereinafter referred to as a set pulse CS). The phase change material may exhibit different characteristics in another embodiment.

Referring to FIG. 2, the phase change material is heated to a temperature higher than the melting temperature (Tm) by the reset pulse AS supplied through the bit line during a first time (T1). Then, the phase change material is rapidly cooled (quenching) and enters into the amorphous state. The amorphous state may be referred to as a reset state in which high data ("1") may be stored.

When the phase change material is heated to a temperature higher than the crystallization temperature (Tc), but lower than the melting point (Tm), the phase change material may enter into the crystalline state. This may occur during a second time T2, which in some embodiments may be longer than the first time T1 (T2>T1), based on the set pulse CS supplied through the bit line. When the heated phase change material is gradually cooled, the phase change material may enter into the crystal state. The crystalline state may be referred to as a set state in which low data ("0") may be stored.

The memory cell has a resistance value that varies depending on the amorphous volume of the phase change material. The resistance value of the memory cell may be highest in the amorphous state and lowest in the crystal state.

Referring to FIGS. 1 and 2, operations of the resistive memory device are described below in accordance with one embodiment. First, during a write operation of the resistive memory device, the access transistor M is turned on when a predetermined voltage is applied to the word line WL. As a result, the current Ic is supplied through the bit line BL to the variable resistor C (e.g., the phase change material). Accordingly, the variable resistor C switches to the crystal state or amorphous state based on temperature in accordance with the data value to be written.

When a reset pulse AS is supplied during a write operation for high data ("1"), the write operation may include a reset operation to switch the phase change material to the reset state. When a set pulse CS is supplied during a write operation for low data ("0"), the write operation may include a set operation to switch the phase change material to the set state. Since the phase change material has a greater resistance value in the amorphous state than in the crystal state, the reset pulse AS applied during the reset operation may have a larger peak current than the set pulse CS applied during the set operation. In contrast, the set pulse CS applied during the set operation may be applied for a longer time than the reset pulse AS is applied during the reset operation, and thus more current is consumed.

During a read operation of the resistive memory device, the access transistor M is turned on when a predetermined voltage is applied to the word line WL and a read pulse is then supplied through the bit line BL to the variable resistor C (e.g., phase change material). In this case, the amount of flowing current varies depending on the resistance value of the phase change material. This aspect is used to determine the state of the phase change material (e.g., the data stored in the phase change material).

In some cases, the write operation of a resistive memory device may require a large amount of current to change the state of the phase change material. Also, latency may increase. In contrast, a read operation may only detect the current state of the phase change material and thus may read the data value using less current and a shorter latency.

Figure 3:
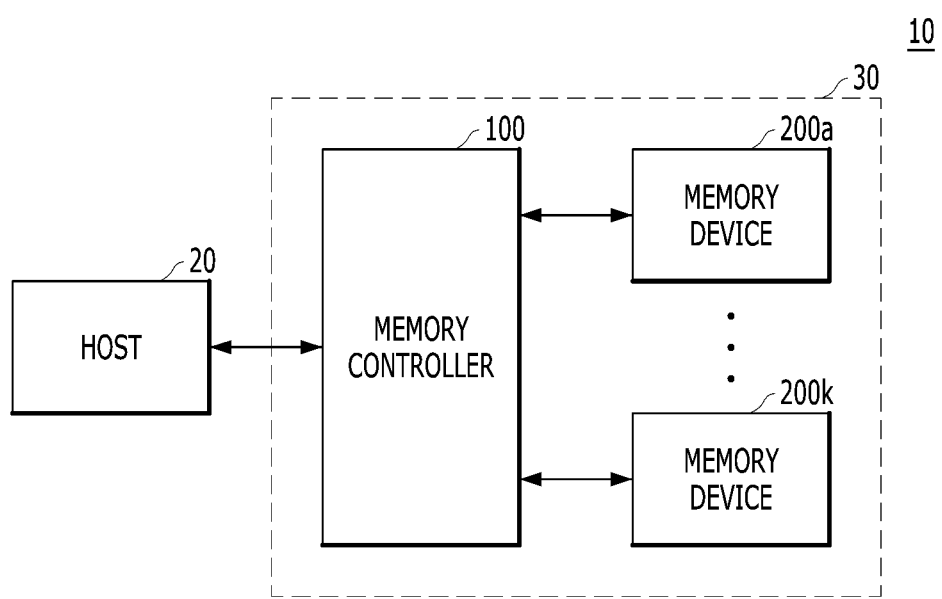
FIG. 3 illustrates an embodiment of an electronic system.

FIG. 3 is a block diagram illustrating an embodiment of an electronic system 10 which may include a host 20 and a memory system 30. The memory system 30 may include a memory controller 100 and one or more semiconductor memory devices 200a to 200k.

The host 20 may communicate with the memory system 30 using an interface protocol, such as PCI-E (Peripheral Component Interconnect-Express), ATA (Advanced Technology Attachment), SATA (Serial ATA), PATA (Parallel ATA), or SAS (serial attached SCSI). The interface protocols between the host 20 and the memory system 30 are not limited to the above-enumerated examples and may also include other interface protocols. Examples include a USB (Universal Serial Bus), MMC (Multi-Media Card), ESDI (Enhanced Small Disk Interface), or IDE (Integrated Drive Electronics).

The memory controller 100 may control overall operation of the memory system 30 and overall data exchange between the host 20 and the semiconductor memory devices 200a to 200k. For example, the memory controller 100 may write data or read data by controlling the semiconductor memory devices 200a to 200n according to a request from the host 20. The memory controller 100 may control operations of the semiconductor memory devices 200a to 200k by applying one or more commands to the semiconductor memory devices 200a to 200k.

According to an embodiment, each of the semiconductor memory devices 200a to 200k may be a resistive memory device. Examples of the resistive memory device include a PCRAM (Phase Changeable RAM), an NFGM (Nano Floating Gate Memory), a PoRAM (Polymer RAM), an MRAM (Magnetic RAM), an FeRAM (Ferroelectric RAM), and a ReRAM (Resistive RAM) device. A PCRAM device is described below as an example. Such a PCRAM device may include a three-dimensional (3D) cross point array and may be implemented as a stacked memory device.

In order to secure reliability, a resistive memory device (e.g., a PCRAM device) may allow a cooling time of a predetermined time or longer after applying a set pulse or a reset pulse for a write operation to a specific cell. During the cooling time, write and read operations on the cell are prohibited. In a PCRAM device, the time when both write and read operations are prohibited to meet the cooling time may correspond to a lockout time, which may be managed, for example, to fall between 1.5 us and 2 us. In one embodiment, memory controller 100 for controlling the resistive memory device may implement a scheduling policy in order to satisfy the lockout time.

Figure 4:
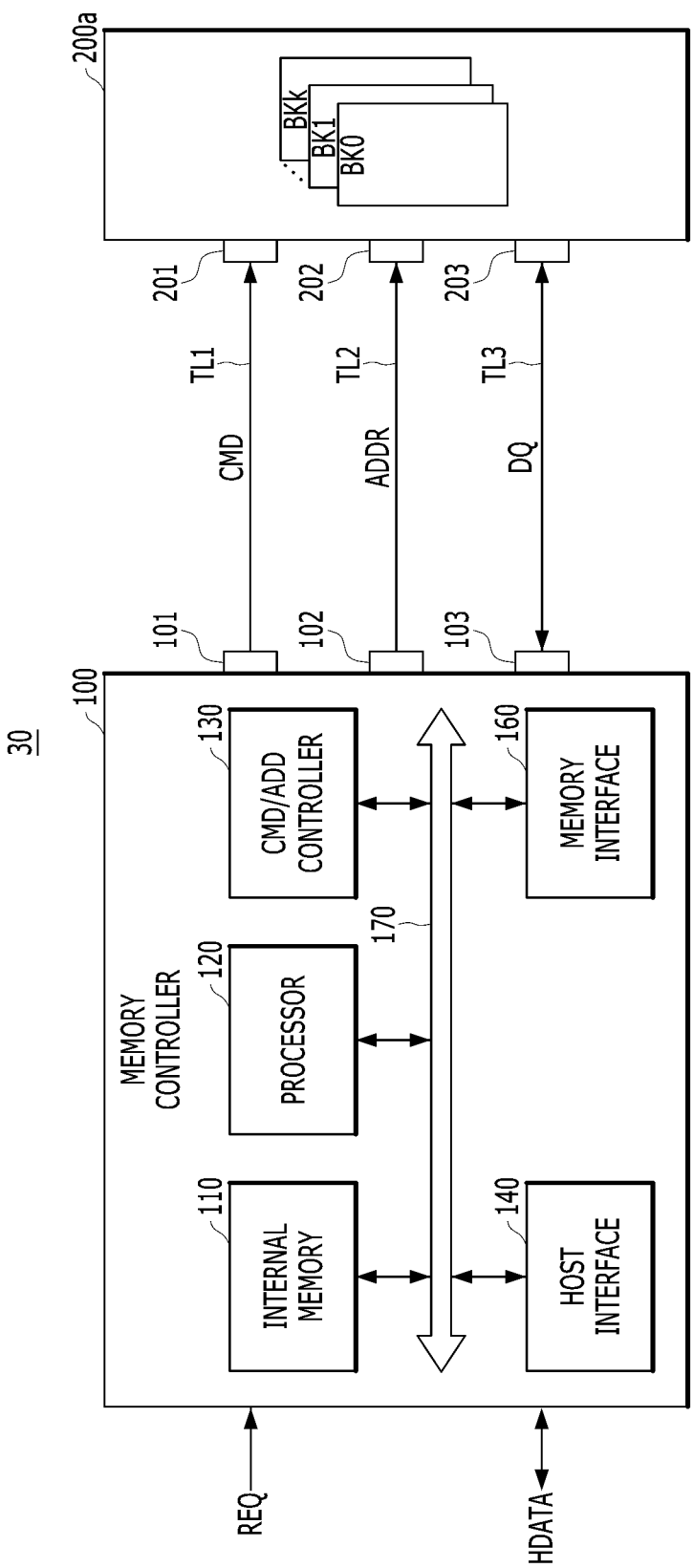
FIG. 4 illustrates an embodiment of a memory system.

FIG. 4 is a block diagram illustrating an embodiment of a memory system 30 including one semiconductor memory device 200a corresponding to the memory controller 100. The memory controller 100 and the semiconductor memory device 200a may be connected to each other through their respective corresponding command pins 101 and 201, address pins 102 and 202, and data pins 103 and 203. The command pins 101 and 201 transmit one or more commands CMD through one or more command transmission lines TL1. The address pins 102 and 202 may transmit addresses ADDR through one or more address transmission lines TL2. The data pins 103 and 203 may exchange data DQ through one or more data transmission lines TL3.

The memory controller 100 may generate a command CMD and an address ADDR according to a request REQ from the host 20, and may provide the generated command CMD and address ADDR to the semiconductor memory device 200a. The memory controller 100 may provide data DQ corresponding to host data HDATA from the host 20 to the semiconductor memory device 200a. The memory controller 100 may receive the data DQ read from the semiconductor memory device 200a and provide the received data DQ to the host 20. In one embodiment, an address included in the request REQ from the host 20 may be a logical address, and the address ADDR transmitted to the semiconductor memory device 200a may be a physical address. Accordingly, the memory controller 100 may store address mapping information and may perform an address conversion operation of converting the logical address into the physical address.

The semiconductor memory device 200a may include a plurality of banks BK0 to BKk, each including a plurality of memory cells and, may perform write or read operations according to commands CMD, addresses ADDR, and/or data DQ from the memory controller 100.

According to an embodiment, the memory controller 100 may generate the command CMD and the address ADDR considering the lock-out time when the request REQ is input from the host 20, and may provide the command CMD and the address ADDR to the semiconductor memory device 200a. The memory controller 100 may schedule the request REQ from the host 20 to thereby generate the command CMD and the address ADDR. When the time interval, from the time when the prior write command on the same memory cell is generated to the time of generation of the command CMD according to the request REQ is short (e.g., less than a predetermined time), the memory controller 100 may stop generating the command and re-schedule the request REQ. In one embodiment, the lock-out time may correspond to the minimum time interval to generate a command for performing a subsequent write operation or read operation on the same memory cell, after generating a write command for performing a write operation on the specific cell.

The memory controller 100 may include, for example, an internal memory 110, a processor 120, a command/address controller 130, a host interface 140, and a memory interface 160.

The internal memory 110 may store various types of system information for use in operation of the memory controller 100, and may further store address mapping information and debugging information for use in operation of the memory system 30. The internal memory 110 may be implemented, for example, as an SRAM, but may be a different type of memory in another embodiment.

The processor 120 may perform various types of computational and/or other operations for controlling the memory device 200a, and/or may execute instructions in the form of firmware or other types of software. The processor 120 may control transmission of requests REQ received from the host 20 to the command/address controller 130 and may transmit host data HDATA to the memory interface 160. The processor 120 may also control overall operations of the internal memory 110, the command/address controller 130, the host interface 140, and the memory interface 160.

When a request REQ is input from the host 20, the command/address controller 130 may schedule the request REQ to thereby generate a command CMD and an address ADDR. In one embodiment, the command/address controller 130 may re-schedule requests REQ that do not satisfy the lock-out time.

The host interface 140 may be configured to communicate with the host 20 (connected to the memory system 30) under the control of the processor 120. For example, the host interface 140 may receive a request REQ and host data HDATA from the host 20 and output the data DQ read from the memory device 200a to the host 20.

The memory interface 160 may be configured to communicate with the memory device 200a under the control of the processor 120. For example, the memory interface 160 may transmit a command CMD, address ADDR, and data DQ to the memory device 200a and transmit the data DQ read from the memory device 200a to the processor 120.

The processor 120 may transmit data between the internal memory 110, command/address controller 130, host interface 140, and memory interface 160 via the bus 170. According to an embodiment, the command/address controller 130, host interface 140, and memory interface 160 may communicate with each other independently without passing through the bus 170. For example, the command/address controller 130 and host interface 140 may communicate directly with each other without passing through the bus 170. The command/address controller 130 and the memory interface 160 may communicate with each other directly without passing through the bus 170. The host interface 140 and the memory interface 160 may also communicate directly with each other without passing through the bus 170.

Figure 5:
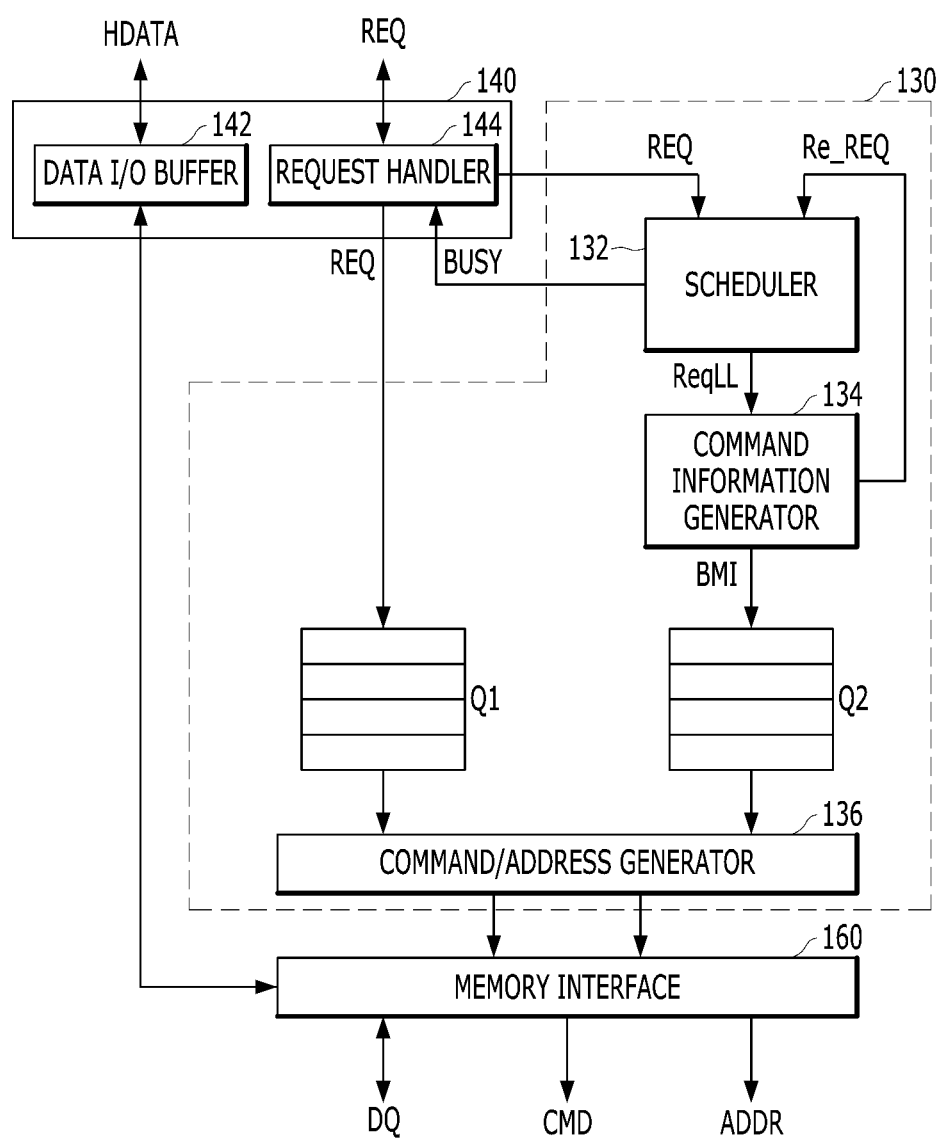
FIG. 5 illustrates an embodiment of a memory controller.

FIG. 5 is a block diagram illustrating an embodiment of the memory controller 100 of FIG. 4, which memory controller includes the host interface 140, the command/address controller 130, and the memory interface 160.

The host interface 140 may receive a request REQ and host data HDATA from the host 20, and output the data DQ read from the memory device 200a to the host 20. For example, the host interface 140 may include a data input/output (I/O) buffer 142 and a request handler 144. The data I/O buffer 142 may temporarily store the host data HDATA from the host 20 during a program operation and may transmit the stored host data HDATA to the memory interface 160 under the control of the processor 120. The data I/O buffer 142 may temporarily store the data DQ from the memory device 200a through the memory interface 160 during a read operation, and may output the stored data to the host 20 under the control of the processor 120. The request handler 144 may transmit the request REQ from the host 20 to the command/address controller 130 and the processor 120. The request handler 144 may be a request distributor which temporarily stores the request REQ to be transmitted to the command/address controller 130 according to a busy signal BUSY and then transmits the request REQ.

The command/address controller 130 may generate the command CMD and address ADDR by scheduling the request REQ which was transmitted from the host 20 through the host interface 140. The command/address controller 130 may generate the command CMD considering a lock-out time. For example, the command/address controller 130 may control access to the memory device 200a according to a lock-out time of the memory device 200a.

In accordance with one embodiment, the command/address controller 130 may include a first queue Q1, a scheduler 132, a command information generator 134, a second queue Q2, and a command/address generator 136.

The first queue Q1 may store a request REQ transmitted from the request handler 144. The first queue Q1 may be implemented, for example, as an SRAM. For example, when the capacity of the first queue Q1 is 128, the first queue Q1 may have 128 entries and may store 128 requests in each entry or in respective ones of the entries. According to an embodiment, the first queue Q1 may include a read request queue for a read request and a write request queue for a write request. The read request and the write request may be separately managed in the read request queue and the write request queue.

When the request REQ from the host 20 is received, the request handler 144 may provide all information of the request REQ including meta information to the first queue Q1. Accordingly, the first queue Q1 may store all information of the request REQ including meta information in each entry. The meta information may be additional management information (except for the command/address information), which, for example, may include error information, wear leveling information, or write disturbance information.

When a request REQ is received from the host 20, the request handler 144 may transmit only user data information (e.g., command/address information except for the meta information) to the scheduler 132. Accordingly, the scheduler 132 may schedule the request REQ using the command/address information in the request REQ.

The scheduler 132 may select and schedule either the request REQ transmitted from the request handler 144 or a re-request Re_REQ transmitted from the command information generator 134. When a re-request Re_REQ is transmitted, the scheduler 132 may transmit a busy signal BUSY to the request handler 144 and may preferentially schedule the re-request Re_REQ. The scheduler 132 may form a linked list structure for tracking the entire input order of requests and per-bank input order and schedule a selected request based on the linked list structure. The scheduler 132 may determine a request ReqLL to be preferentially allocated to the command information generator 134 using a policy for maximizing the throughput. An example configuration of the scheduler 132 will be described with reference to FIG. 6.

The command information generator 134 may generate command generation information BMI by managing timing parameters for each bank according to an output of the scheduler 132, e.g., the request ReqLL allocated by scheduler 132. The command information generator 134 may determine whether to issue the command generation information BMI considering lock-out time and reissue the request ReqLL as the re-request Re_REQ depending on whether to issue the command generation information BMI. When the request ReqLL allocated by the scheduler 132 does not satisfy the lock-out time, the command information generator 134 may not generate the command generation information BMI and may reissue a re-request Re_REQ to the scheduler 132. The action of reissuing a request ReqLL to the scheduler 132 that fails to satisfy the lock-out time may be referred to as a re-insert operation. Embodiments of the command information generator 134 are described with reference to FIGS. 6 to 10.

The second queue Q2 may receive and store the command generation information BMI. The second queue Q2 may receive the command generation information BMI and then classify and store the command generation information by command type. For example, the second queue Q2 may store the same separately for a buffer write operation, bank write operation, buffer read operation, bank read operation, and calibration operation depending on the command generation information BMI. In one embodiment, the second queue Q2 may be implemented as a first-in-first-out (FIFO) buffer for storing commands by type.

The command/address generator 136 may generate a command CMD and an address ADDR according to information stored in the first queue Q1 and the second queue Q2. The command/address generator 136 may generate a command CMD and an address ADDR based on request information stored in the first queue Q1 and command generation information BMI stored in the second queue Q2. In this case, the command/address generator 136 may convert the logical address in the request REQ provided from the host 20 to a physical address using address mapping information stored in the internal memory 110, a result of which is to generate an address ADDR. However, embodiments of the disclosure are not limited thereto. According to an embodiment, the processor 120 may convert the logical address in the request REQ provided from the host 20 to a physical address using address mapping information stored in the internal memory 110 and then provide the same to the command/address generator 136.

The memory interface 160 may transmit the command CMD, the address ADDR, and the data DQ to the memory device 200a and transmit the data DQ read from the memory device 200a to the processor 120.

Figure 6:
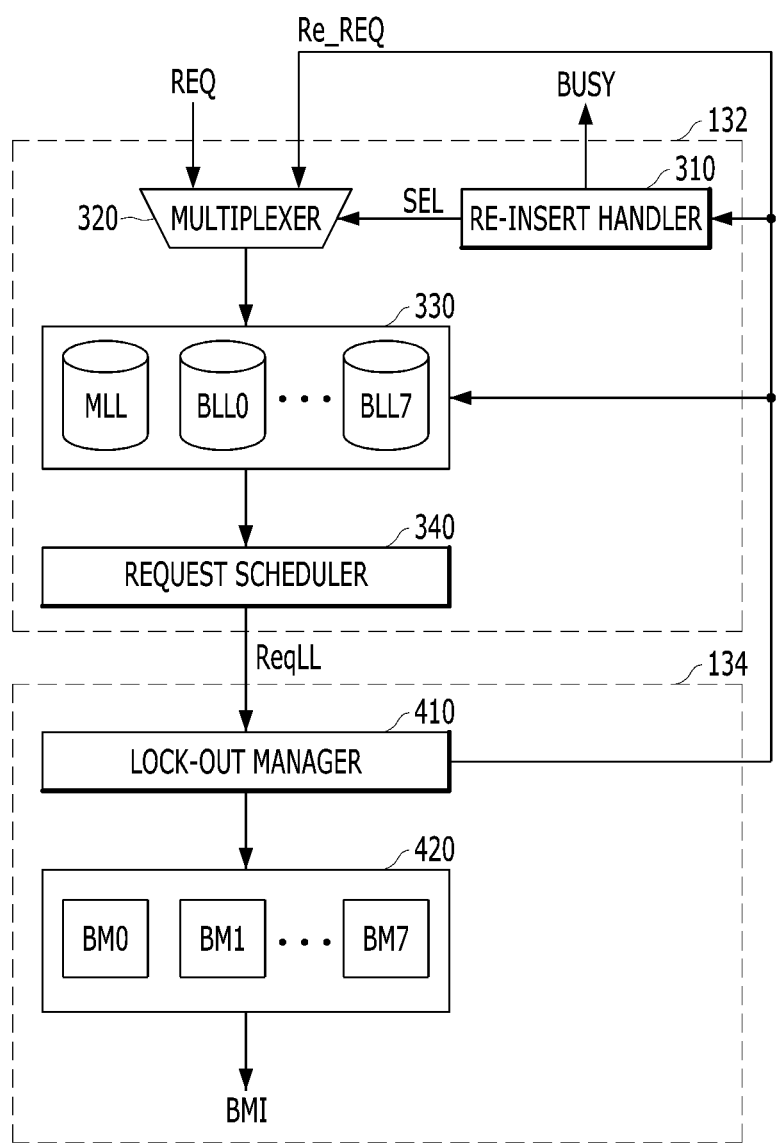
FIG. 6 illustrates an embodiment of a scheduler and command information generator.

FIG. 6 is a block diagram illustrating an embodiment of the scheduler 132 and command information generator 134 of FIG. 5. Hereinafter, for convenience of description, an example is described in which eight banks are provided in a memory device.

Referring to FIG. 6, the scheduler 132 may include a re-insert handler 310, a multiplexer 320, a request linked list 330, and a request scheduler 340. When a re-request Re_REQ is reissued from the command information generator 134, the re-insert handler 310 may transmit a busy signal BUSY to the request handler 144 and generate a selection signal SEL for selecting a re-request Re_REQ. The multiplexer 320 may select one of the request REQ or the re-request Re_REQ according to the selection signal SEL. The request linked list 330 may be a component for managing requests provided from the multiplexer 320 in a linked list structure, and may structure or store data to allow the entire input order of requests/per-bank input order to be known.

In one embodiment, the request linked list 330 may include a main linked list MLL (in which the entire input order of requests is structured) and a plurality of bank linked lists BLL0 to BLL7 (in which the input order of each bank is structured). First to eighth bank linked lists BLL0 to BLL7 may be arranged when eight banks are provided in the memory device. The request scheduler 340 may schedule the request from the multiplexer 320 based on the linked list structure of the request linked list 330 and allocate it to the command information generator 134. For example, based on the main linked list MLL and the first to eighth bank linked lists BLL0 to BLL7, the request scheduler 340 may determine the request ReqLL to be preferentially allocated to the command information generator 134 using a policy for maximizing throughput.

The command information generator 134 may include a lock-out manager 410 and a bank machine set 420. The bank machine set 420 may include first to eighth bank machines BM0 to BM7 respectively corresponding to the banks. The first to eighth bank machines BM0 to BM7 may manage timing parameters in units of banks (e.g., per bank) in the memory device 200a according to the request ReqLL allocated from the request scheduler 340, and may generate the command generation information BMI based on the timing parameters. The first to eighth bank machines BM0 to BM7 correspond to the first to eighth banks, respectively. In one embodiment, each bank machine may be implemented as a state machine, e.g., a finite state machine (FSM).

When command generation information BMI is generated, the lock-out manager 410 may determine whether to generate a command corresponding to the request ReqLL allocated from the request scheduler 340 based on the lock-out time. The lock-out manager 410 may determine whether to issue the re-request Re_REQ or the command generation information BMI generated from the bank machine set 420 according to the result of this determination. For example, when the time interval from the time of generation of the prior write command for the same memory cell to the time of generation of the currently generated command according to the request ReqLL is less than the lock-out time based on the command generation information BMI, the lock-out manager 410 may determine that it is inappropriate to generate a command, mask issuance of the command generation information BMI, and reissue a request ReqLL (as a re-request Re_REQ) to the scheduler 132.

When a re-insert operation (in which a re-request Re_REQ is reissued to the scheduler 132) is performed, the request processing order may be changed from the originally intended order. According to an embodiment, the lock-out manager 410 may include at least one virtual circular queue (VCQ) corresponding to the first to eighth bank machines BM0 to BM7, respectively. The lock-out manager 410 may track the re-request Re_REQ re-ordered according to the re-insert operation using the virtual circular queue (VCQ), and then determine whether the order of processing the request ReqLL is appropriate according to the tracking result.

The lock-out manager 410 may determine whether to issue the command generation information BMI generated from the bank machine set 420 according to the result of the determination and issue a re-request Re_REQ depending on whether the command generation information BMI is issued. When the processing order is determined to be inappropriate, the lock-out manager 410 may mask issuance of command generation information BMI and reissue a request ReqLL (as a re-request Re_REQ) to the scheduler 132. According to an embodiment, the virtual circular queue (VCQ) may be physically placed in the request linked list 330 and the lock-out manager 410 may logically manage the virtual circular queue (VCQ). For example, the virtual circular queue (VCQ) may be disposed in each of the first to eighth bank linked lists BLL0 to BLL7 of the request linked list 330. The lock-out manager 410 may share the virtual circular queue (VCQ) with the request linked list 330.

Figure 7:
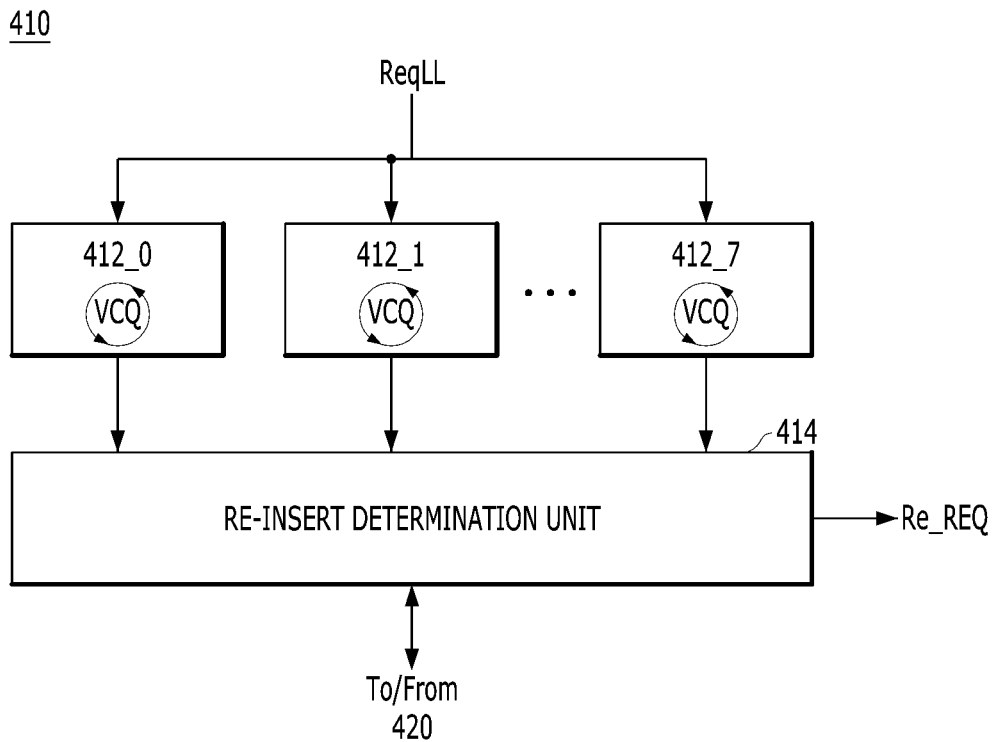
FIGS. 7, 8, and 9 illustrate an embodiment of a lock-out manager.
Figure 8:
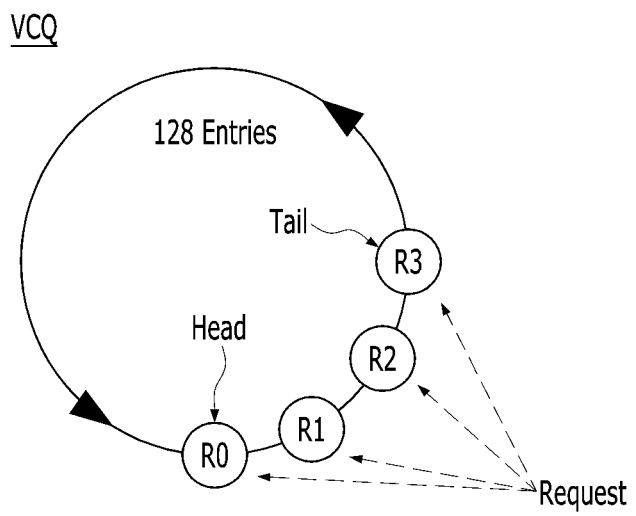
Figure 9:
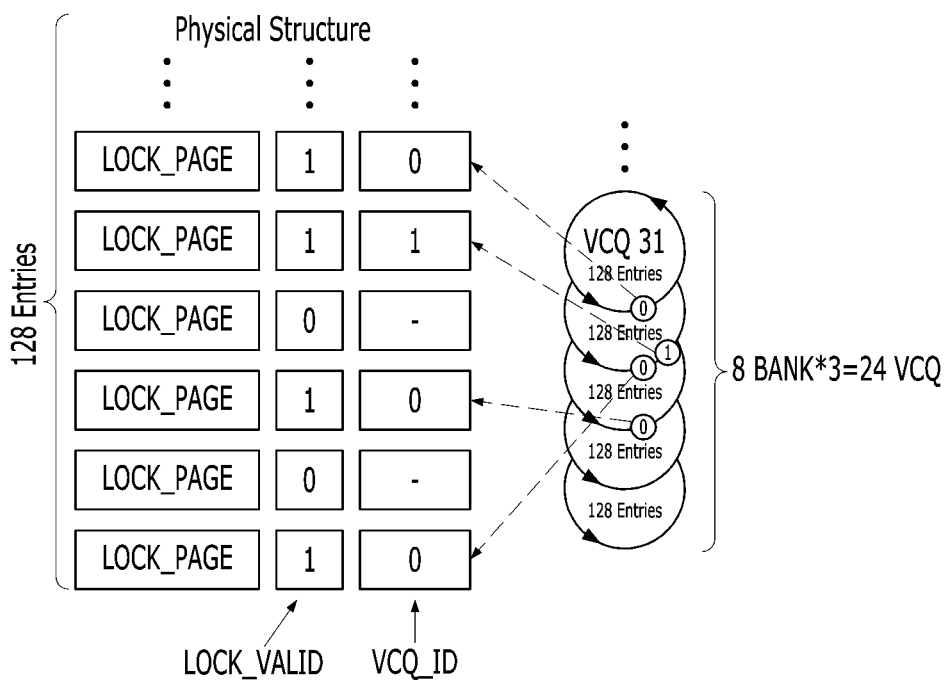

FIGS. 7, 8, and 9 are views illustrating an embodiment of the lock-out manager 410 of FIG. 6.

Referring to FIG. 7, the lock-out manager 410 may include first to eighth lock-out units 412_0 to 412_7 and a re-insert determination unit (or logic) 414. The first to eighth lock-out units 412_0 to 412_7 may correspond to the first to eighth bank machines BM0 to BM7, respectively. Each of the first to eighth lock-out units 412_0 to 412_7 may be implemented as at least one virtual circular queue (VCQ). The number of virtual circular queues (VCQ) in each lock-out unit may be set considering the first time and the second time. In one embodiment, the first time may correspond to the lock-out time, e.g., the first time may correspond to a minimum time interval set to generate a subsequent command after generating a command for performing a write operation on the same memory cell. The second time may correspond to a minimum time interval set to generate a subsequent command after generating a command for performing a write operation on the same bank.

For example, where the first time (lock-out time) is a minimum time when the same cell is accessible and is set to 1500 ns and where the second time is a minimum time when the same bank is accessible and is set to 500 ns, the number of virtual circular queues (VCQ) in each lock-out unit may be determined to be three, which equals the second time/first time. This is why the requests of the virtual circular queues (VCQ) all may be processed after the first time, even though 128 requests are continuously input for the same bank according to the second time protocol and all the virtual circular queues (VCQ) are filled up.

Referring to FIG. 8, the virtual circular queue VCQ in each lock-out unit may have a maximum depth (or capacity) corresponding to the depth of the first queue Q1. For example, when the depth (or capacity) of the first queue Q1 is 128, the virtual circular queue VCQ may have up to 128 entries. The virtual circular queue (VCQ) may include a head indicating the start position of the entries, a tail indicating the last position, and a depth indicating the number of the entries.

Referring to FIG. 9, the virtual circular queue (VCQ) may include a physical structure (e.g., physical or logical buffer or storage area) including up to a predetermined number of entries, e.g., 128 entries. In another embodiment, the virtual circular queue (VCQ) may have a different number of entries. Each entry may include a valid-lock bit LOCK_VALID that is set when a request ReqLL that does not meet the lock-out time is input, an ID VCQ_ID that is sequentially given when the valid-lock bit LOCK_VALID is set, and page information LOCK_PAGE for the bank/row/column address corresponding to the request ReqLL.

In one embodiment, the virtual circular queue (VCQ) may not be physically disposed in the first to eighth lock-out units 412_0 to 412_7, but may be logically disposed in the first to eighth lock-out units 412_0 to 412_7 and virtually managed. In one implementation, the virtual circular queue (VCQ) may be physically disposed in the request linked list 330. For example, the virtual circular queues (VCQ) of the first to eighth lock-out units 412_0 to 412_7 may be physically disposed in the first to eighth bank linked lists BLL0 to BLL7, respectively. In the first to eighth lock-out units 412_0 to 412_7, only the depth, head, and tail may be managed in the form of a circular queue. For reference, when the number of virtual circular queues (VCQ) disposed in eight lock-out units corresponding to eight banks is set to three, 24 virtual circular queues (VCQ) may be provided.

Referring back to FIG. 7, when command generation information BMI is generated, the re-insert determination unit 414 may determine whether it is appropriate to generate the command corresponding to the request ReqLL considering the lock-out time. When a request ReqLL failing to meet the lock-out time, the re-insert determination unit (or logic) 414 may mask the issuance of command generation information BMI and reissue a request ReqLL (as a re-request Re_REQ) to the scheduler 132. The re-insert determination unit 414 may track the re-request Re_REQ using the virtual circular queues (VCQ) of the first to eighth lock-out units 412_0 to 412_7 and then determine whether the processing order of request ReqLL is appropriate depending on the tracking result. When the processing order of request ReqLL is determined to be inappropriate, the re-insert determination unit 414 may mask the issuance of command generation information BMI and reissue a request ReqLL (as a re-request Re_REQ) to the scheduler 132.

When the re-request Re_REQ is reissued, the re-insert determination unit 414 may create an entry of the virtual circular queue (VCQ) of the corresponding lock-out unit and manage the depth, head, and tail of the virtual circular queue (VCQ). For example, when the re-request Re_REQ is reissued, the re-insert determination unit 414 may create an entry of the virtual circular queue (VCQ) of the lock-out unit corresponding to the re-request Re_REQ, set the valid-lock bit LOCK_VALID of the created entry, increase the ID VCQ_ID, and store the page information LOCK_PAGE corresponding to the re-request Re_REQ in the corresponding entry. When the valid-lock bit LOCK_VALID is set, the re-insert determination unit 414 may update the depth, head, and tail, thereby tracking the re-request Re_REQ. The re-insert determination unit 414 may designate the ID VCQ_ID allocated to the first input request ReqLL as the head and the ID VCQ_ID allocated to the last input request ReqLL as the tail.

According to an embodiment, the re-insert determination unit 414 may determine whether the order of processing the request ReqLL is appropriate according to the head of the virtual circular queue VCQ. When the valid-lock bit LOCK_VALID corresponding to the request ReqLL is set, the re-insert determination unit 414 may identify whether is the ID VCQ_ID corresponding to the request ReqLL matches the head of the virtual circular queue (VCQ). When they are identified to match each other, the re-insert determination unit 414 may control the first to eighth bank machines BM0 to BM7 to issue command generation information BMI corresponding to the request ReqLL. Accordingly, a read or write operation corresponding to the request ReqLL may be performed. The re-insert determination unit 414 may increase the head by +1 and decrease the depth by −1 after a normal read or write operation is performed.

When the ID VCQ_ID corresponding to the request ReqLL does not match the head of the virtual circular queue (VCQ) or when the valid-lock bit LOCK_VALID corresponding to the request ReqLL is released, the re-insert determination unit 414 may determine that the processing order of the request ReqLL is inappropriate because a preceding request exists. In this case, the re-insert determination unit 414 may reissue a request ReqLL as a re-request Re_REQ, generate an entry corresponding to the re-request Re_REQ, and update the depth, head, and tail, thereby tracking the re-request Re_REQ.

When the head and tail of the virtual circular queue (VCQ) match, and the depth becomes "0", it means that the re-request Re_REQ reissued to the scheduler 132 has been fully processed. Thus, the re-insert determination unit 414 may terminate management of the virtual circular queue (VCQ). Embodiments for performing a re-insert operation according to an embodiment are described below.

FIGS. 10, 11, 12A, and 12B are views illustrating embodiments of the operation of the lock-out manager 410 of FIG. 7.

Figure 10:
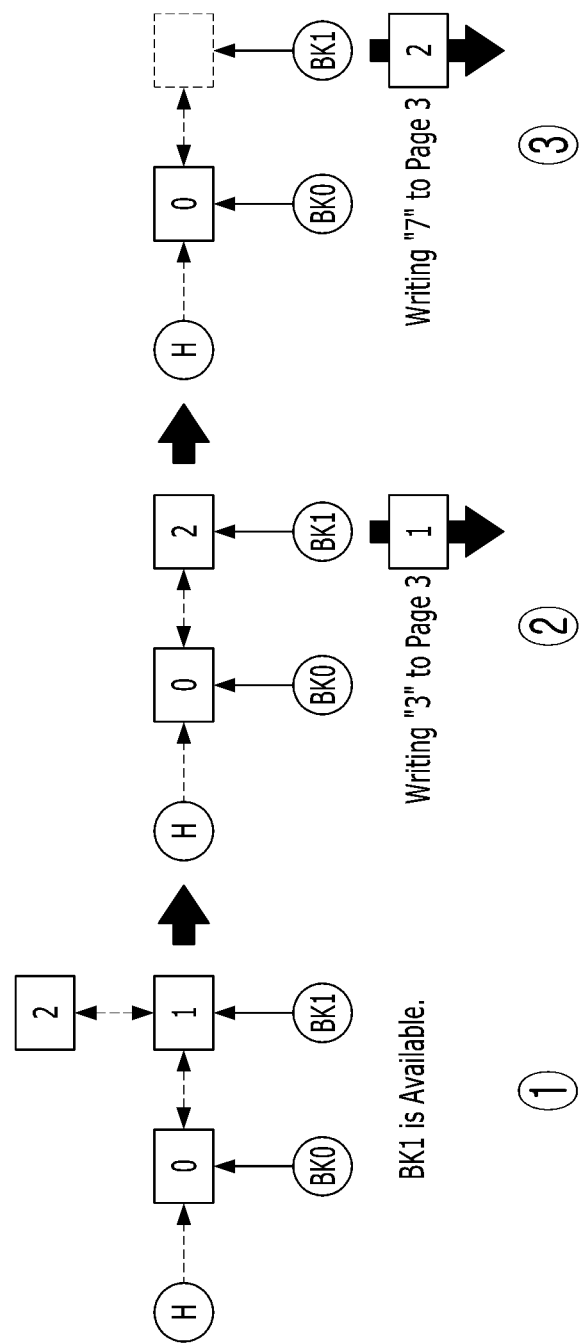
FIGS. 10, 11, 12A, and 12B illustrate operational embodiments of the lock-out manager.

FIG. 10 illustrates an example in which all requests transmitted from a host meet the lock-out time. Referring to FIG. 10, a request R0 for the first bank BK0 is input, and requests R1 and R2 for the second bank BK1 are sequentially input. In this case, it is assumed that the request R1 requests a write operation for writing "3" to page #3 of the second bank BK1, and the request R2 requests a write operation for writing "7" to page #3 of the same second bank BK1.

When the second bank BK1 becomes available (①), the second bank machine BM1 manages the timing parameters of the second bank BK1 according to the request R1 and generates command generation information BMI based on the timing parameters. The lock-out manager 410 may determine that the request R1 has satisfied the lock-out time and may issue command generation information BMI. Accordingly, a write command CMD and an address ADD may be generated, and a write operation for writing "3" to page #3 may be performed (②). Thereafter, the second bank machine BM1 may generate command generation information BMI according to the request R2, and the lock-out manager 410 may determine that the request R2 has satisfied the lock-out time and thus generate command generation information BMI. Accordingly, a write command CMD and an address ADDR may be generated, and a write operation for writing "7" to page #3 may be performed (③). Finally, "7" intended by the host may be written to page #3 of the second bank BK1.

Figure 11:
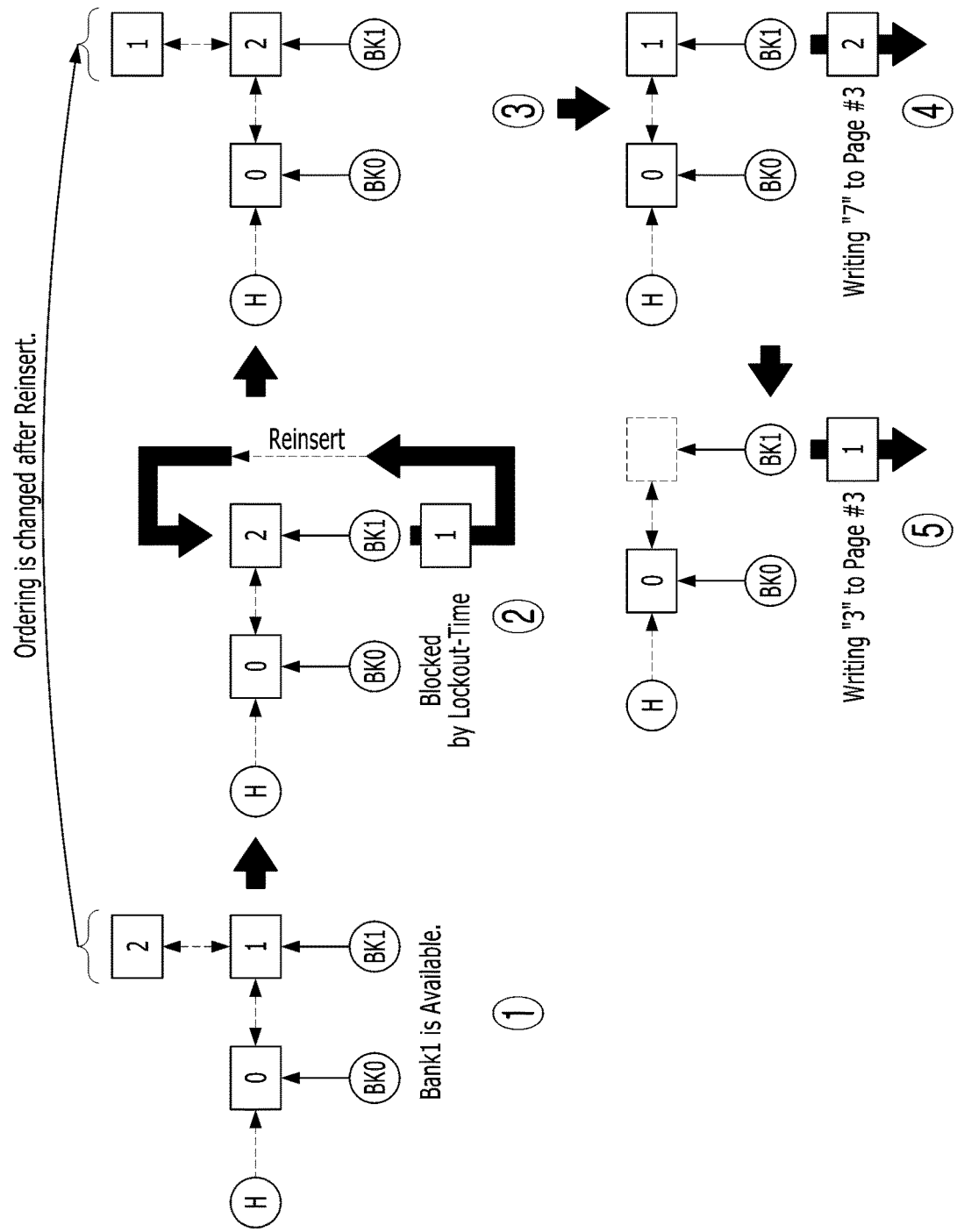

FIG. 11 illustrates an example of issues that may arise when it is determined whether to generate a command corresponding to a request transmitted from the host considering the lock-out time, but the processing order of request according to re-ordering is not taken into consideration.

Referring to FIG. 11, under the same condition, when the second bank BK1 becomes available (①), the second bank machine BM1 manages the timing parameters of the second bank BK1 according to the request R1 and generates command generation information BMI based on the timing parameters. The lock-out manager 410 may determine that the request R1 does not meet the lock-out time, mask the issuance of command generation information BMI, and issue a re-request Re_REQ to the scheduler 132 (②). For example, the re-insert operation may be performed, and accordingly the processing order of request based on the re-ordering may be changed (③).

Thereafter, the second bank machine BM1 may generate command generation information BMI according to the request R2, and the lock-out manager 410 may determine that the request R2 has satisfied the lock-out time and thus may generate command generation information BMI. Accordingly, a write command CMD and an address ADDR may be generated, and a write operation for writing "7" to page #3 may be performed (④).

Thereafter, the second bank machine BM1 may generate command generation information BMI according to the reissued request R1, and the lock-out manager 410 may determine that the request R1 has satisfied the lock-out time and thus may generate command generation information BMI. Accordingly, a write command CMD and an address ADDR may be generated, and a write operation for writing "3" to page #3 may be performed (⑤). Additionally, "3" (rather than "7" intended by the host) may finally be written to page #3 of the second bank BK1. That is, when the request is re-ordered by the re-insert operation, the request processing order may be changed and a malfunction other than is intended by the host may be performed.

Figure 12A:
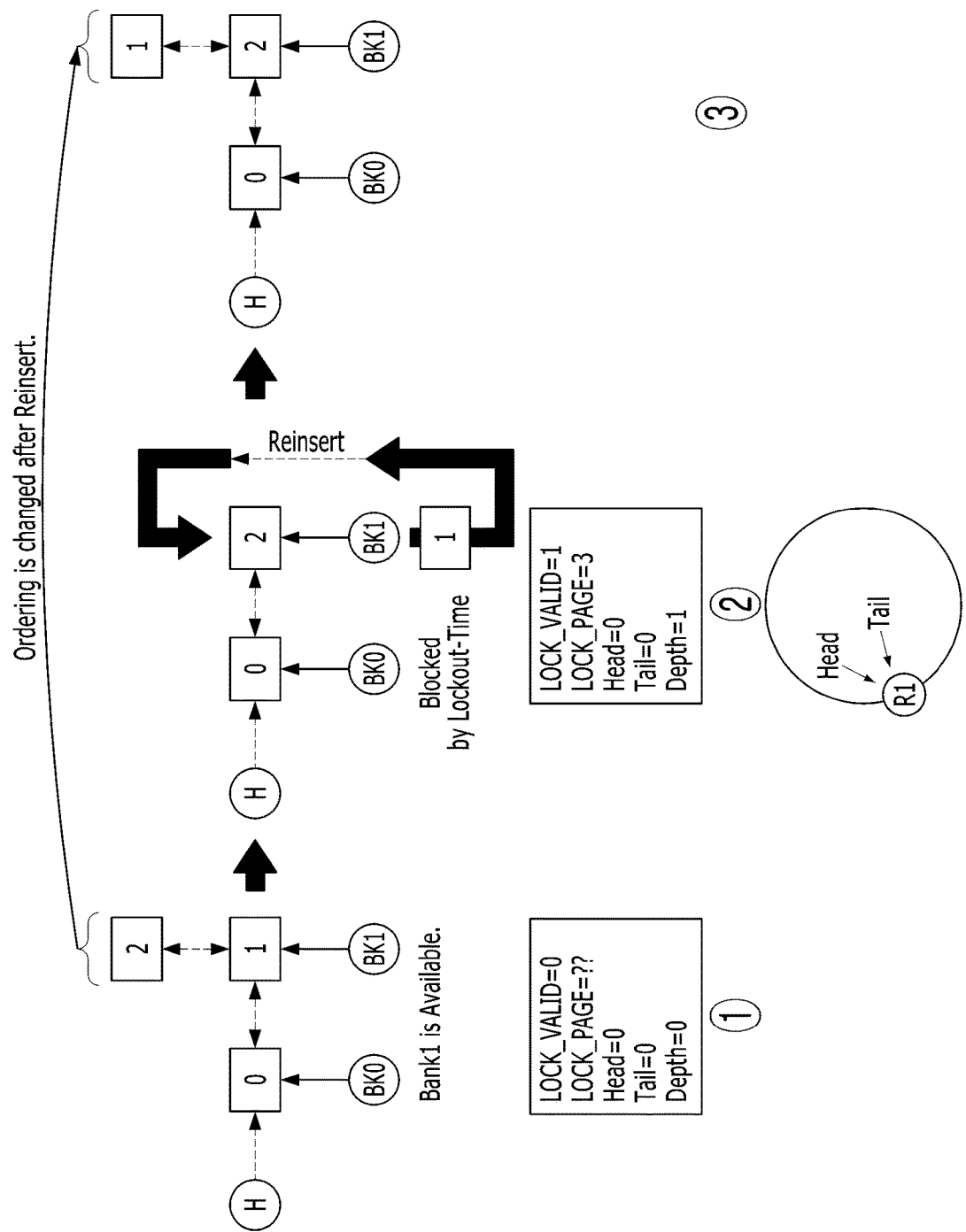
Figure 12B:
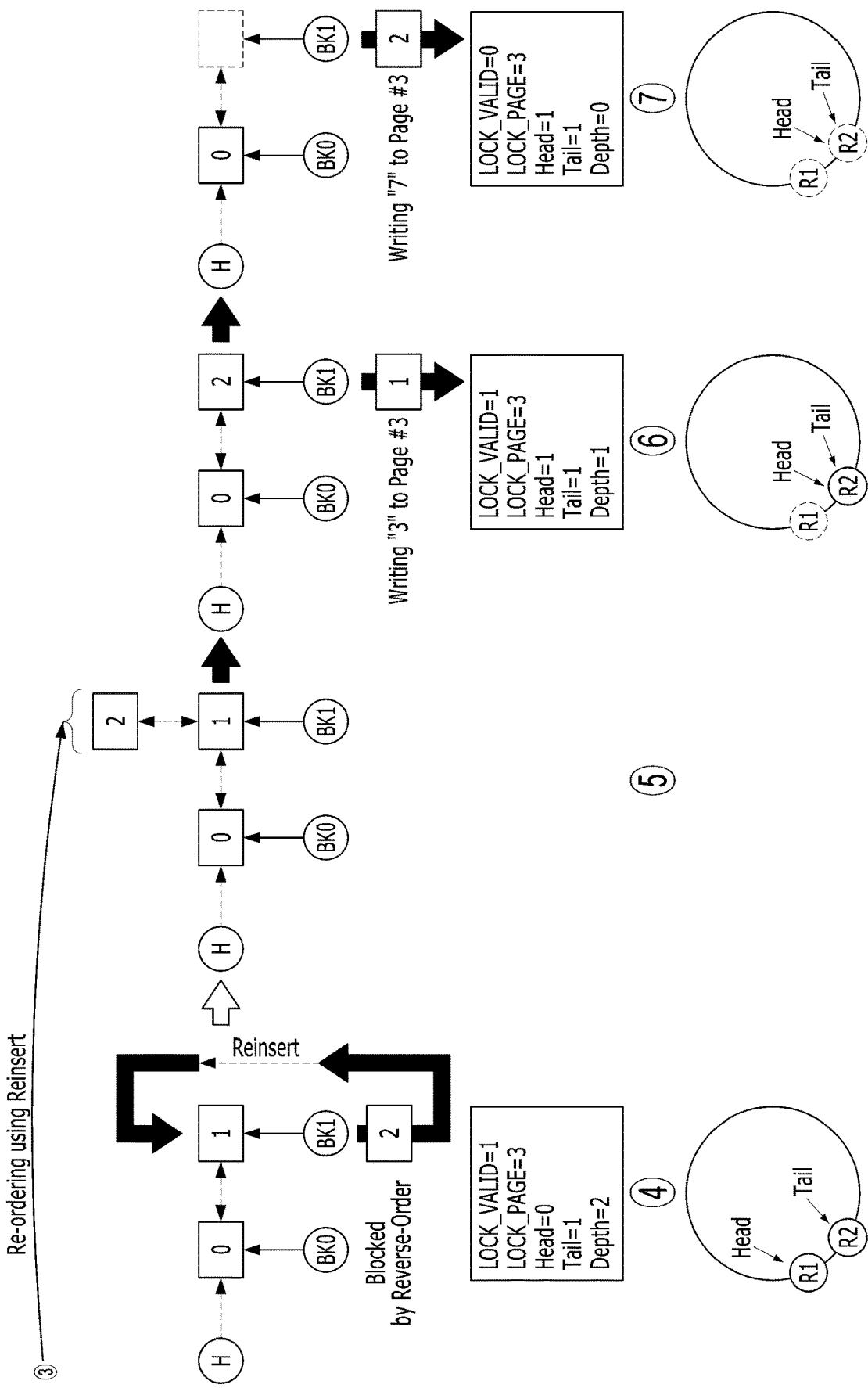

FIGS. 12A and 12B illustrate examples of determining whether to generate a command corresponding to a request considering both the lock-out time and a request processing order according to re-ordering according to an embodiment.

Referring to FIG. 12A, under the same conditions, the second bank BK1 becomes available (①). In this case, since the virtual circular queue VCQ of the second lock-out unit 412_1 corresponding to the second bank BK1 is initialized and no entry is created, the depth, head, and tail all become "0".

The second bank machine BM1 manages the timing parameters of the second bank according to the request R1 and generates command generation information BMI based on the timing parameters. The lock-out manager 410 may determine that the request R1 does not meet the lock-out time, mask the issuance of command generation information BMI, and issue a re-request Re_REQ to the scheduler 132 (②). For example, the re-insert operation may be performed, and accordingly the processing order of request according to the re-ordering may be changed (③). In this case, the re-insert determination unit 414 may generate an entry of a virtual circular queue (VCQ) corresponding to the re-request Re_REQ, set a valid-lock bit LOCK_VALID of the generated entry, and increase the ID VCQ_ID. The re-insert determination unit 414 may store page information LOCK_PAGE corresponding to the request R1 in a corresponding entry. The re-insert determination unit 414 may update the depth, head, and tail of the virtual circular queue VCQ to "1", "0", and "0", respectively.

Referring to FIG. 12B, the second bank machine BM1 may thereafter generate command generation information BMI according to the request R2. In this case, although the request R2 has satisfied the lock-out time and since the depth of the virtual circular queue VCQ is set to "1", the re-insert determination unit 414 may determine whether the processing order of the request R2 is appropriate according to the head. When the ID VCQ_ID of the request R2 is released, the re-insert determination unit 414 may mask issuance of command generation information BMI and issue a re-request Re_REQ to the scheduler 132 (④).

The re-insert determination unit 414 may generate an entry corresponding to the re-request Re_REQ, set a valid-lock bit LOCK_VALID of the generated entry, and increase the ID VCQ_ID. As a new entry is created, the re-insert determination unit 414 may update the depth, head, and tail of the virtual circular queue VCQ to "2", "0", and "1", respectively. The re-insert operation may be performed, and accordingly the processing order of request according to the re-ordering may be restored (⑤).

Thereafter, the second bank machine BM1 may generate command generation information BMI according to the reissued request R1. In this case, although the request R1 has satisfied the lock-out time and since the depth of the virtual circular queue VCQ is set to "2", the re-insert determination unit 414 may determine whether the processing order of the request R2 is appropriate according to the head. The re-insert determination unit 414 may issue command generation information BMI corresponding to the request R2 when the ID VCQ_ID of the request R2 matches the head. Accordingly, a write command CMD and an address ADDR may be generated, and a write operation for writing "3" to page #3 may be performed (⑥). The re-insert determination unit 414 may increase the head by +1 and decrease the depth by −1 after a write operation is performed. For example, the re-insert determination unit 414 may update the depth, head, and tail of the virtual circular queue VCQ to "1", "1", and "1", respectively.

Thereafter, the second bank machine BM1 generates command generation information BMI according to the reissued request R2. In this case, although the request R2 has satisfied the lock-out time and since the depth of the virtual circular queue VCQ is set to "1", the re-insert determination unit 414 may determine whether the processing order of the request R1 is appropriate according to the head.

The re-insert determination unit 414 may issue command generation information BMI corresponding to the request R1 when the ID VCQ_ID of the request R1 matches the head. Accordingly, a write command CMD and an address ADDR may be generated and a write operation for writing "7" to page #3 may be performed (⑦). The re-insert determination unit 414 may decrease the depth by −1 after a write operation is performed. In this case, since the depth becomes "0", the head may be maintained at "1", which is the same as the tail. In other words, the re-insert determination unit 414 may update the depth, head, and tail of the virtual circular queue VCQ to "0", "1", and "1", respectively.

Thereafter, since the head and tail of the virtual circular queue (VCQ) match and the depth becomes "0", the re-insert determination unit 414 may terminate management of the virtual circular queue (VCQ). Additionally, "7" which is intended by the host may be written to page #3 of the second bank BK1 by determining whether to generate a command corresponding to the request, considering both the lock-out time and the request processing order according to the re-ordering.

Figure 13:
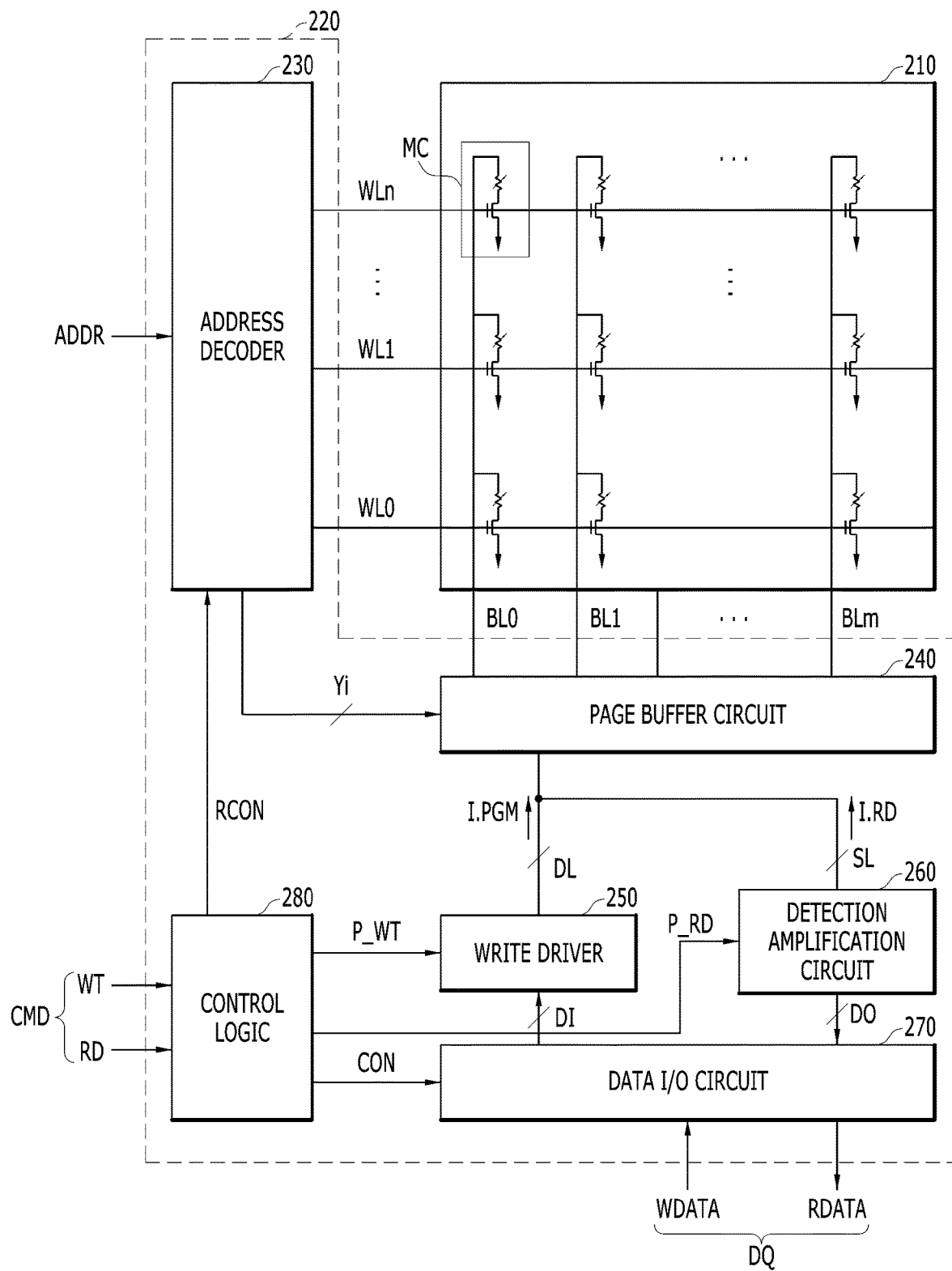
FIG. 13 illustrate an embodiment of a memory device.

FIG. 13 is a block diagram illustrating an embodiment of the memory device of FIG. 4. Referring to FIG. 13, the memory device 200a may include a memory cell array 210 and a peripheral circuit 220.

The memory cell array 210 may include a plurality of memory cells MC. The plurality of memory cells MC may be memory cells including the phase change material, for example, described with reference to FIGS. 1 and 2. Each of the plurality of memory cells MC may include a first state in which the phase change material has the crystal state (e.g., set state) and a second state in which the phase change material has the amorphous state (e.g., reset state). The plurality of memory cells MC of the memory cell array 210 may be (directly or indirectly) connected to the peripheral circuit 220 through word lines WL0 to WLn and bit lines BL0 to BLm.

The peripheral circuit 220 may receive a command CMD, an address ADDR, and data DQ from the memory controller 100. The peripheral circuit 220 may receive a write command WT, write data WDATA, and an address ADDR from the memory controller 100 during a write operation. During a read operation, the peripheral circuit 220 may receive a read command RD and an address ADDR from the memory controller 100 and output read data RDATA. During a write operation, the peripheral circuit 220 may determine whether the write data WDATA is data in the set state or data in the reset state. When the write data WDATA is data in the set state, the peripheral circuit 220 may apply a first pulse (e.g., set pulse) to the target memory cell corresponding to the address ADDR. When the write data WDATA is data in the reset state, the peripheral circuit 220 may apply a second pulse (e.g., reset pulse) to the target memory cell.

In one embodiment, the peripheral circuit 220 may include an address decoder 230, a page buffer circuit 240, a write driver 250, a detection amplification circuit 260, a data input/output circuit 270, and a control logic 280.

The control logic 280 may control the address decoder 230, the page buffer circuit 240, the write driver 250, the detection amplification circuit 260, and the data input/output circuit 270. In response to the read command RD and the read command RD, the control logic 280 may provide a row control signal RCON to the address decoder 230, a pulse control signal P_WT to the write driver 250, a sensing control signal P_RD to the detection amplification circuit 260, and an input/output control signal CON to the data input/output circuit 270.

The address decoder 230 is connected to the memory cell array 210 through word lines WL0 to WLn. The address decoder 230 decodes an externally input address ADDR according to the row control signal RCON from the control logic 280 and provides a bias to the selected word line. The address decoder 230 generates a selection signal Yi for selecting bit lines BL0 to BLm. The selection signal Yi is provided to the page buffer circuit 240.

The page buffer circuit 240 is connected to the memory cell array 210 through bit lines BL0 to BLm. The page buffer circuit 240 selects a bit line in response to the selection signal Yi from the address decoder 230. The page buffer circuit 240 connects the bit line BL and the data line DL and connects the bit line BL and the sensing line SL in response to the selection signal Yi.

The write driver 250 provides a program pulse I_PGM to the data line DL according to the pulse control signal P_WT and input data DI. The program pulse I_PGM may include a set pulse, a reset pulse, or biases for additional operations.

The detection amplification circuit 260 detects the difference between the voltage of the sensing line SL and a reference voltage VREF according to the sensing control signal P_RD, reads data stored in the target memory cell, and provides the data as output data DO. The reference voltage VREF may be provided by a reference voltage generation circuit.

The data input/output circuit 270 may receive the write data WDATA according to the input/output control signal CON and provide it as input data DI, or the data input/output circuit 270 may output the output data DO provided from the detection amplification circuit 260, as read data RDATA, to the controller or a test device.

Figure 14:
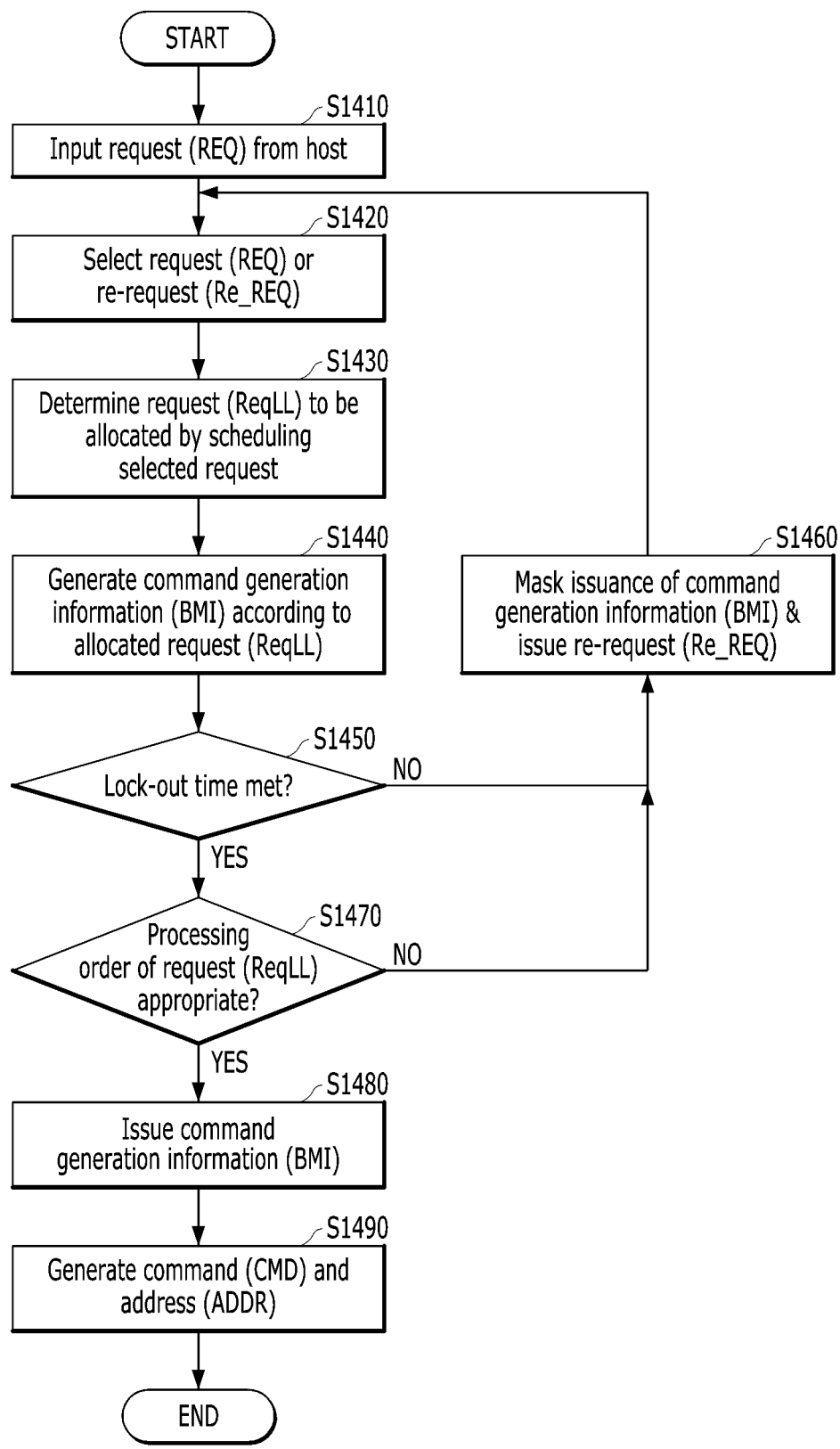
FIG. 14 illustrate an embodiment of the operation of a memory system.

FIG. 14 is a flowchart illustrating an embodiment of a method for operating a memory system, which, for example, may correspond to any of the embodiments of the memory system described herein.

Referring to FIG. 14, the request handler 144 receives a request REQ from the host 20 (S1410). The request handler 144 may provide all information of the request REQ including meta information to the first queue Q1 and may transmit only user data information (e.g., command/address information), except for meta information, to the scheduler 132. The first queue Q1 may store a request REQ transmitted from the request handler 144.

The scheduler 132 may select and schedule either the request REQ transmitted from the request handler 144 or the re-request Re_REQ transmitted from the command information generator 134. For example, the re-insert handler 310 generates a selection signal SEL to select the request REQ when the re-request Re_REQ is not reissued from the command information generator 134. When a re-request Re_REQ is reissued from the command information generator 134, the re-insert handler 310 transmits a busy signal BUSY to the request handler 144 and generates a selection signal SEL for selecting a re-request Re_REQ. The multiplexer 320 may select one of the request REQ or the re-request Re_REQ according to the selection signal SEL (S1420). In this case, the request handler 144 may temporarily store the request REQ to be transmitted to the command/address controller 130 according to a busy signal BUSY and may then transmit the request REQ.

The request scheduler 340 may determine a request ReqLL to be preferentially allocated to the command information generator 134. This may be accomplished by scheduling the request from multiplexer 320 based on the linked list structure of the request linked list 330 (S1430).

The first to eighth bank machines BM0 to BM7 of the command information generator 134 may manage timing parameters in units of banks (e.g., per bank) in the memory device 200*a* according to the request ReqLL allocated from the request scheduler 340, and generate the command generation information BMI based on the timing parameters (S1440).

The lock-out manager 410 determines whether it is appropriate to generate a command corresponding to the request ReqLL allocated from the request scheduler 340 considering the lock-out time (S1450). When the request ReqLL does not satisfy the lock-out time (e.g., when the time interval from the time of generation of the prior write command generated for the same memory cell to the time of generation of a command to be currently scheduled to be generated according to the request ReqLL is less than the lock-out time (e.g., "NO" in S1450)), the lock-out manager 410 may determine that the command generation is inappropriate, mask the issuance of command generation information BMI, and issue a re-request Re_REQ to the scheduler 132 (S1460). In this case, when the re-request Re_REQ is reissued, the re-insert determination unit 414 of the lock-out manager 410 may create an entry in the virtual circular queue (VCQ) corresponding to the re-request Re_REQ, set the valid-lock bit LOCK_VALID of the generated entry, increase the ID (VCQ_ID), and store page information LOCK_PAGE in the corresponding entry. When the valid-lock bit LOCK_VALID is set, the re-insert determination unit 414 may update the depth, head, and tail.

When the request ReqLL meets the lock-out time (e.g., "YES" in S1450), the lock-out manager 410 may determine whether the processing order of request ReqLL meets the originally intended request processing time according to the head of the virtual circular queue VCQ (S1470). The re-insert determination unit 414 may identify whether the ID VCQ_ID of the request ReqLL matches the head. When the result of identification reveals that they do not match ("NO" in S1470), the re-insert determination unit (or logic) 414 may mask issuance of command generation information BMI and issue a re-request Re_REQ to the scheduler (S1460). Likewise, the re-insert determination unit 414 may create an entry in the corresponding virtual circular queue VCQ, set the valid-lock bit LOCK_VALID of the generated entry, increase the ID (VCQ_ID), and store page information LOCK_PAGE in the corresponding entry. When the valid-lock bit LOCK_VALID is set, the re-insert determination unit 414 may update the depth, head, and tail.

When they are identified to match each other (e.g., "YES" in S1470), the re-insert determination unit 414 may control the first to eighth bank machines BM0 to BM7 to issue command generation information BMI corresponding to the request ReqLL (S1480). Accordingly, a read or write operation corresponding to the request ReqLL may be performed. The re-insert determination unit 414 may increase the head by +1 and decrease the depth by −1 after a normal read or write operation is performed. When the head and tail of the virtual circular queue (VCQ) match and the depth becomes "0", the re-insert determination unit 414 may terminate management of the virtual circular queue (VCQ).

The second queue Q2 may receive and store the command generation information BMI, and the command/address generator 136 may generate a command CMD and an address ADDR according to information stored in the first queue Q1 and the second queue Q2 (S1490).

As described above, according to an embodiment, when a request failing to meet the lock-out time of the resistive memory device is input in generating a command according to a request from the host, the corresponding request may be re-inserted into the scheduler without creating the corresponding command. Then, a command may be recreated. In a memory system supporting a re-insert operation according to an embodiment, a corresponding bank machine becomes available from occupied even within the lock-out time, and commands for different addresses in the same bank may be processed. For example, since the lock-out time is relatively long, 10 read commands may be processed during that time. Accordingly, it is possible to achieve both bandwidth efficiency and quality-of-service (QoS) of the resistive memory device by preventing creation of a command failing to meet the lock-out time. The resistive memory device may be more reliable by preventing creation of commands failing to meet the lock-out time. Further, according to an embodiment, a command may be generated considering the processing order of requests according to re-ordering based on the results of tracking of the re-inserted request using the virtual circular queue VCQ. That is, the virtual circular queue (VCQ) for tracking re-inserted requests is physically placed in the request linked list and is managed only logically, so that the increase in area may be minimized by using the existing resources.

Figure 15:
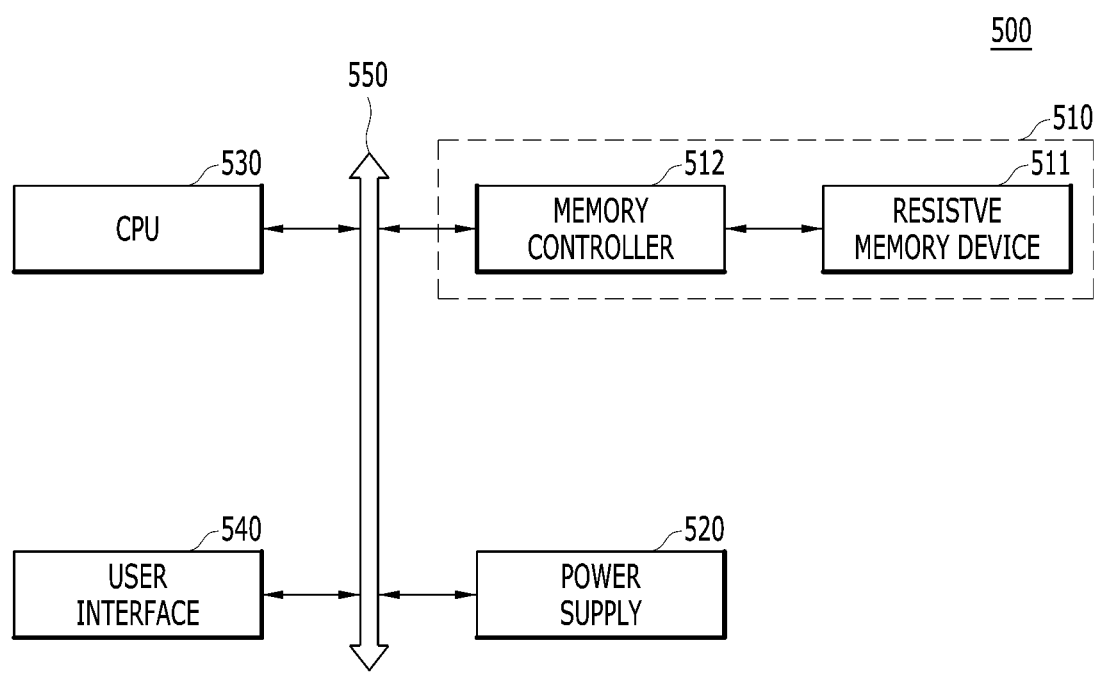
FIG. 15 illustrate an embodiment of a computing system.

FIG. 15 is a block diagram schematically illustrating an embodiment of a computing system 500 including a resistive memory device 511. The resistive memory device 511 may corresponding to any of the embodiments described herein.

Referring to FIG. 15, the computing system 500 may include a memory system 510 comprising a resistive memory device 511 and a memory controller 512, a central processing unit (CPU) 530 electrically connected to a system bus 550, a user interface 540, and a power supply 520.

The resistive memory device 511 stores data provided through the user interface 540 or processed by the central processing unit 530, via the memory controller 512.

According to an embodiment, when a request failing to meet the lock-out time of the resistive memory device is input in generating a command according to a request from the host, the memory controller 512 re-inserts the request to the scheduler without creating the corresponding command, and then recreates a command.

According to an embodiment, the memory controller 512 may generate a command considering the processing order of requests according to re-ordering that results from the re-insert operation.

Accordingly, it is possible to achieve both bandwidth efficiency and quality-of-service (QoS) of the resistive memory device 511 by preventing creation of a command failing to meet the lock-out time. Reliability may be secured by preventing creation of commands failing to meet the lock-out time. The embodiments of the computing system described herein may further include an application chipset, a camera image processor (CIS), and a mobile DRAM.

The controllers, processors, devices, handlers, units, multiplexers, schedulers, generators, managers, logic, interfaces, decoders, drivers, generators, modules, and other signal generating and signal processing features of the embodiments disclosed herein may be implemented, for example, in non-transitory logic that may include hardware, software, or both. When implemented at least partially in hardware, the controllers, processors, devices, handlers, units, multiplexers, schedulers, generators, managers, logic, interfaces, decoders, drivers, generators, modules, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, devices, handlers, units, multiplexers, schedulers, generators, managers, logic, interfaces, decoders, drivers, generators, modules, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

It should be noted that although the technical spirit of the disclosure has been described in connection with preferred embodiments thereof, this is merely for description purposes and should not be interpreted as limiting. It should be appreciated by one of ordinary skill in the art that various changes may be made thereto without departing from the technical spirit of the disclosure.

What is claimed is:
1. A memory system, comprising:
a resistive memory device configured to perform a read operation and a write operation based on a command and an address, wherein the resistive memory device includes a plurality of banks each including a plurality of memory cells; and
a memory controller configured to schedule a request from a host to generate the command and the address, wherein, when a time interval is less than a first time, the memory controller is configured to stop generation of the command and re-schedule the command corresponding to the request, the time interval spanning from a time of generation of a prior write command for a same memory cell to a time of generation of the command generated according to the request.

2. The memory system of claim 1, wherein the first time is a minimum time interval set to generate a command to, after generating a command for performing a write operation on a memory cell, perform a subsequent write operation or read operation on the same memory cell.

3. The memory system of claim 1, wherein the memory controller includes:
a scheduler configured to select and schedule the request from the host or a re-request;
a plurality of bank machines configured to generate command generation information by managing timing parameters for the respective banks according to a request allocated by the scheduler;
a lock-out manager configured to determine whether to issue the command generation information or the re-request based on the first time; and
a command/address generator configured to generate the command and the address according to the request from the host and the command generation information.

4. The memory system of claim 3, wherein the lock-out manager includes:
a plurality of lock-out units corresponding to the plurality of bank machines, respectively, each of the plurality of lock-out units including at least one virtual circular queue; and
a re-insert determination logic configured to mask issuance of the command generation information and reissue the allocated request, as the re-request, when:
the allocated request fails to satisfy the first time; or
an order of processing the allocated request is inappropriate according to a result of tracking the re-request using the virtual circular queues of the lock-out units.

5. The memory system of claim 4, wherein when the re-request is reissued, the re-insert determination logic is configured to create an entry of a virtual circular queue corresponding to the re-request, and update a depth, head, and tail of the virtual circular queue to track the re-request.

6. The memory system of claim 3, wherein when the re-request is reissued from the lock-out manager, the scheduler is configured to transmit a busy signal to temporarily store the request from the host, and prioritize the re-request in scheduling.

7. The memory system of claim 3, wherein the scheduler includes:
a re-insert handler configured to generate a selection signal to select the re-request when the re-request is reissued, and transmit a busy signal to temporarily store the request;
a multiplexer configured to select either the request or the re-request according to the selection signal;
a request linked list configured to manage a request provided from the multiplexer in a linked list structure; and
a request scheduler configured to schedule the request provided from the multiplexer to allocate the scheduled request to the plurality of bank machine, based on the linked list structure.

8. The memory system of claim 1, wherein the plurality of memory cells include a phase change material configured to have a first state or a second state, and
wherein the first state includes a set state in which the phase change material has a crystal state, and the second state includes a reset state in which the phase change material has an amorphous state.

9. A memory controller, comprising:
a first queue configured to store a request from a host;
a scheduler configured to select and schedule either the request or a re-request;
a plurality of bank machines configured to generate command generation information by managing timing parameters for respective banks included in a memory device according to a request allocated by the scheduler;
a lock-out manager configured to determine whether to issue the command generation information or the re-request based on a first time that corresponds to a minimum time interval set to generate a command to, after generating a command for performing a write operation on a memory cell included in a bank, perform a subsequent write operation or read operation on the same memory cell;
a second queue configured to store the command generation information; and
a command/address generator configured to generate a command and an address according to information stored in the first queue and the second queue.

10. The memory controller of claim 9, wherein:
when a time interval is less than the first time, based on the command generation information, the lock-out manager is configured to mask issuance of the command generation information and reissues the allocated request as the re-request; and
the time interval spans from a time of generation of a prior write command for the same memory cell to a time of generation of the command generated according to the allocated request.

11. The memory controller of claim 9, wherein the lock-out manager is configured to:
determine whether an order of processing the allocated request is appropriate according to a result of tracking the re-request using at least one virtual circular queue corresponding to each of the plurality of bank machines;
mask issuance of the command generation information; and
reissue the allocated request as the re-request.

12. The memory controller of claim 11, wherein:
the scheduler includes a plurality of bank linked lists in which an entire input order and per-bank input order of requests from the host are structured; and
the lock-out manager shares the virtual circular queue with the bank linked lists.

13. The memory controller of claim 9, wherein the lock-out manager includes:
a plurality of lock-out units corresponding to the plurality of bank machines, respectively, each of the plurality of lock-out units including at least one virtual circular queue; and
a re-insert determination logic configured to mask issuance of the command generation information and reissue the allocated request, as the re-request, when:
the allocated request fails to satisfy the first time; or
an order of processing the allocated request is inappropriate according to a result of tracking the re-request using the virtual circular queues of the lock-out units.

14. The memory controller of claim 13, wherein:
a number of the virtual circular queues disposed in each of the lock-out units is set based on the first time and a second time; and
the second time corresponds to a minimum time interval set to generate a command to, after generating a command to perform a write operation on a bank included in the memory device, perform a subsequent write operation or read operation on the same bank.

15. The memory controller of claim 14, wherein a depth of each of the virtual circular queues corresponds to a depth of the first queue.

16. The memory controller of claim 13, wherein when the re-request is reissued, the re-insert determination logic is configured to create an entry of a virtual circular queue corresponding to the re-request, and update a depth, head, and tail of the virtual circular queue to track the re-request.

17. The memory controller of claim 9, wherein when the re-request is reissued from the lock-out manager, the scheduler is configured to transmit a busy signal to temporarily store the request from the host, and prioritize the re-request in scheduling.

18. The memory controller of claim 9, wherein the scheduler includes:
   a re-insert handler configured to generate a selection signal to select the re-request when the re-request is reissued, and transmit a busy signal to temporarily store the request;
   a multiplexer configured to select either the request or the re-request according to the selection signal;
   a request linked list configured to manage a request provided from the multiplexer in a linked list structure; and
   a request scheduler configured to schedule the request provided from the multiplexer to allocate the scheduled request to the plurality of bank machines, based on the linked list structure.

19. The memory controller of claim 18, wherein the request linked list includes:
   a main linked list configured to structure an entire input order of the requests; and
   a plurality of bank linked lists configured to structure a per-bank input order of the requests.

20. The memory controller of claim 18, further comprising
   a request handler configured to provide the request from the host to the first queue or the scheduler, temporarily store the request according to the busy signal, and then re-transmit the request.

21. A method for operating a memory controller, the method comprising:
   storing a request from a host in a first queue;
   selecting and scheduling either the request or a re-request;
   generating command generation information by managing timing parameters for respective banks included in a memory device according to a request allocated by a scheduler;
   determining whether to issue the command generation information or the re-request based on a first time that corresponds to a minimum time interval set to generate a command to, after generating a command for performing a write operation on a memory cell included in a bank, perform a subsequent write operation or read operation on the same memory cell;
   storing the command generation information in a second queue; and
   generating a command and an address according to information stored in the first queue and the second queue.

22. The method of claim 21, wherein:
   the determining of whether to issue the command generation information or the re-request considering the first time includes, when time interval is less than the first time, based on the command generation information, masking issuance of the command generation information and reissuing the allocated request as the re-request; and
   the time interval spans from a time of generation of a prior write command for the same memory cell to a time of generation of the command generated according to the allocated request.

23. The method of claim 21, further comprising:
   determining whether an order of processing the allocated request is appropriate according to a result of tracking the re-request using at least one virtual circular queue corresponding to each of the banks;
   masking issuance of the command generation information; and
   reissuing the allocated request as the re-request.

24. The method of claim 23, further comprising,
   when the re-request is reissued, creating an entry of a virtual circular queue corresponding to the re-request, and updating a depth, head, and tail of the virtual circular queue to track the re-request.

25. The method of claim 21, wherein the selecting and scheduling of either the request or the re-request includes,
   when the re-request is reissued, transmitting a busy signal to temporarily store the request from the host, and prioritizing the re-request in scheduling.

* * * * *